US008478547B2

(12) United States Patent
Hadley et al.

(10) Patent No.: US 8,478,547 B2
(45) Date of Patent: Jul. 2, 2013

(54) BLADE MONITORING SYSTEM

(75) Inventors: Steven Ross Hadley, Sunol, CA (US); Charles Terrance Hatch, Gardnerville, NV (US)

(73) Assignee: General Electric Company, Schenectady, NY (US)

( * ) Notice: Subject to any disclaimer, the term of this patent is extended or adjusted under 35 U.S.C. 154(b) by 312 days.

(21) Appl. No.: 12/852,631

(22) Filed: Aug. 9, 2010

(65) Prior Publication Data

US 2012/0035861 A1 Feb. 9, 2012

(51) Int. Cl.
*G07C 3/00* (2006.01)
*H01L 22/20* (2006.01)
*G01H 1/003* (2006.01)

(52) U.S. Cl.
USPC .................... 702/34; 702/35; 702/66; 702/71

(58) Field of Classification Search
None
See application file for complete search history.

(56) References Cited

U.S. PATENT DOCUMENTS

| | | | | |
|---|---|---|---|---|
| 4,573,358 | A * | 3/1986 | Luongo | 73/660 |
| 4,922,757 | A * | 5/1990 | Rozelle et al. | 73/660 |
| 5,115,454 | A | 5/1992 | Kucar | |
| 5,818,797 | A | 10/1998 | Watanabe et al. | |
| 6,137,283 | A * | 10/2000 | Williams et al. | 324/76.12 |
| 6,346,907 | B1 | 2/2002 | Dacy et al. | |
| 2006/0120197 | A1 * | 6/2006 | Teolis et al. | 365/226 |
| 2010/0100345 | A1 * | 4/2010 | Katrak et al. | 702/65 |
| 2011/0293403 | A1 * | 12/2011 | Badami | 415/118 |
| 2011/0320137 | A1 * | 12/2011 | Rajagopalan et al. | 702/34 |
| 2011/0320138 | A1 * | 12/2011 | Rajagopalan et al. | 702/34 |

FOREIGN PATENT DOCUMENTS

EP 0620423 B1 2/1997

OTHER PUBLICATIONS

Lawson et al., "Tubomachinery Blade Vibration Amplitude Measurement Through Tip Timing With Capacitance Tip Clearance Probes", Sensors and Actuators A: Physical, vol. 118, Issue 1, Jan. 31, 2005, pp. 14-24.

* cited by examiner

*Primary Examiner* — Jonathan C Teixeira Moffat
*Assistant Examiner* — Regis Betsch
(74) *Attorney, Agent, or Firm* — Hiscock & Barclay LLP

(57) ABSTRACT

A blade monitoring system for calculating average threshold crossings from interpolated threshold crossings of digital waveform samples is disclosed. Each digital waveform sample is converted by an analog-to-digital converter from one of two split analog signals. Each split analog signal is received from a signal splitter that receives each analog signal from an analog signal transmitter. Each analog signal is from a sensed blade passing signal from at least one row of a plurality of blades on a compressor of a turbine.

20 Claims, 4 Drawing Sheets

BLADE MONITORING SYSTEM

BACKGROUND OF THE INVENTION

This invention relates generally to turbines and more particularly to a system for blade monitoring in turbines for monitoring of blades for damage.

Compressors, such as gas turbine compressors, receive inlet air from an air source and compress that air so that it may be later combined with fuel in a combustion chamber. The gas created from combustion of the compressed air and fuel mixture is then used to force rotation of blades within the gas turbine compressor, and correspondingly, perform mechanical work on a shaft coupled to those blades. Over time, portions of the gas turbine compressor may become damaged. Gas turbine compressor blades may become damaged, for example, by particles, foreign objects, and/or corrosive elements in the inlet air, as well as excessive high cycle and low-cycle fatigue during compressor operation. Damage to gas turbine compressor blades may cause inefficiencies in gas turbine operation and/or unwanted vibrations in the compressor. In some cases, compressor blade damage may cause liberation of one or more blades, resulting in catastrophic damage to the compressor.

In a similar way, steam turbine compressors receive steam and compress the steam to high pressures forcing rotation of blades within the steam turbine compressor. Blades within a steam turbine compressor are susceptible to similar damage as described for gas turbine compressors.

BRIEF DESCRIPTION OF THE INVENTION

A system, method, and computer program product for blade monitoring is disclosed.

A first aspect of the invention includes a system, comprising: a turbine including a compressor having at least one row of a plurality of blades; a sensor for sensing a blade passing signal of at least one of the plurality of blades; an analog signal transmitter for transmitting an analog signal for the blade passing signal; a signal splitter for splitting the analog signal into at least two split analog signals; at least two analog-to-digital (AD) converters, each AD converter converting each split analog signal to at least two digital waveform samples; and a blade monitoring system that: calculates at least two interpolated threshold crossings, each interpolated threshold crossing calculated from at least two digital waveform samples from each AD converter; and calculates an average threshold crossing (ATC) of the at least two interpolated threshold crossings.

A second aspect of the invention includes a method, comprising: sensing a blade passing signal of a blade; creating an analog signal for the blade passing signal; splitting the analog signal into at least two split analog signals; converting each split analog signal to at least two digital waveform samples; and calculating an interpolated threshold crossing for each of the at least two digital waveform samples, wherein at least two interpolated threshold crossings are calculated; and calculating an average threshold crossing (ATC) of at least two interpolated threshold crossings.

A third aspect of the invention includes a computer program product comprising program code embodied in at least one computer-readable storage medium, which when executed, enables a computer system to implement a method, the method comprising: receiving at least four digital waveform samples, wherein a blade passing signal of a blade is transmitted as an analog signal, wherein a splitter splits the analog signal, wherein at least two analog-to-digital (AD) converters convert each split analog signal to at least two digital waveform samples; calculating an interpolated threshold crossing for the at least two digital waveform samples from each AD converter, wherein at least two interpolated threshold crossings are calculated; and calculating an average threshold crossing (ATC) of the at least two interpolated threshold crossings.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
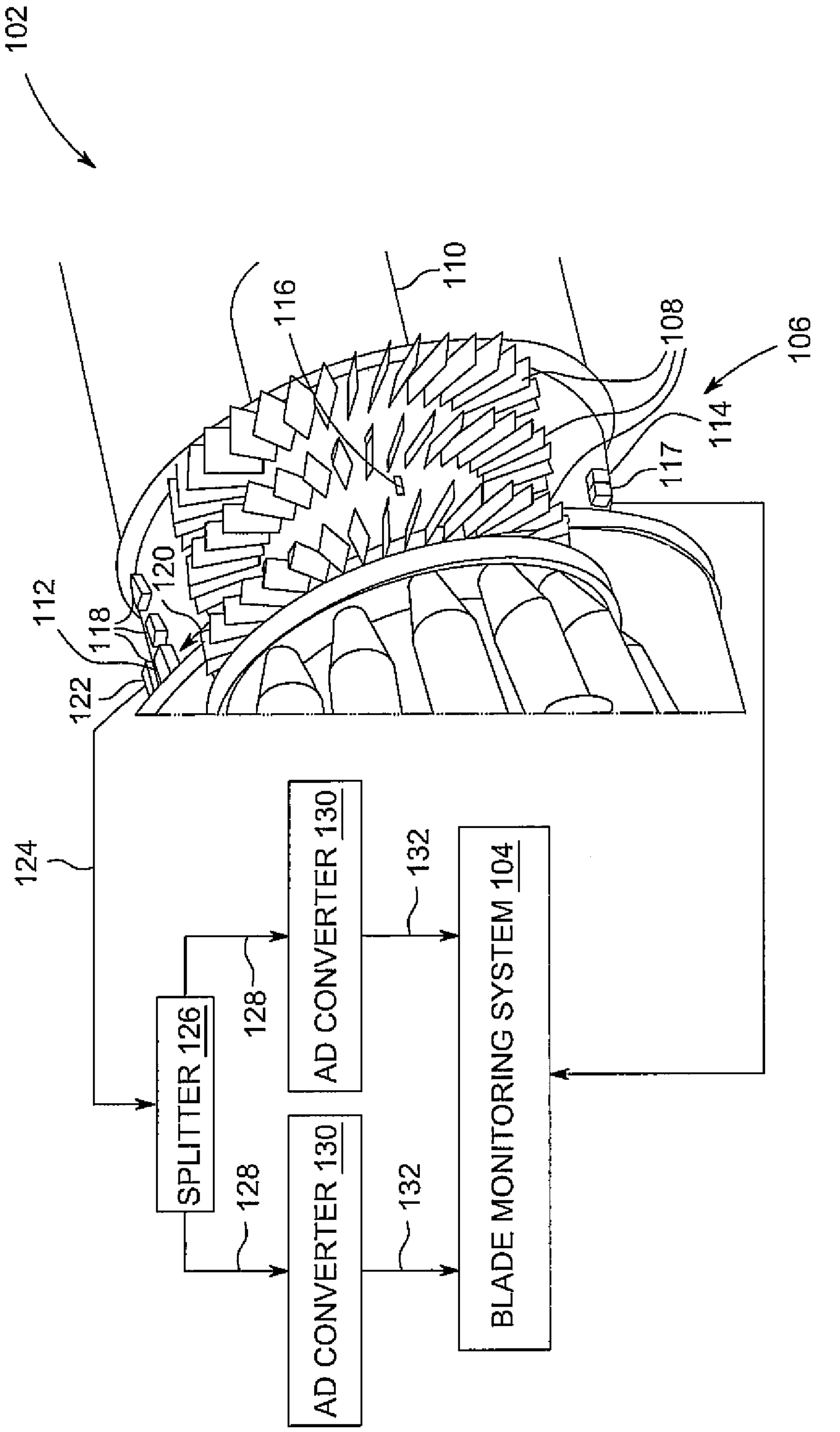
FIG. 1 shows a perspective partial cut-away view of a turbine and one embodiment of a blade monitoring system in accordance with the invention.

Referring to FIG. 1, a perspective partial cut-away view of a turbine 102 and one embodiment of a blade monitoring system 104 in accordance with the invention is shown. Turbine 102 is only illustrative; teachings of the invention may be applied to a variety of turbines including gas turbines and steam turbines. In this embodiment, turbine 102 includes a compressor 106 including a plurality of blades 108, and a rotor 110. Blades 108 are attached to rotor 110. Combustion gases in gas turbines or steam in steam turbines propel blades 108. Propelled blades 108 rotate rotor 110. A casing 112 forms an outer enclosure that encloses compressor 106, blades 108, and rotor 110. Blades 108 are shown in rows. Three rows are shown but is only illustrative. Teachings of the invention may be applied to any number of rows of blades 108.

A once-per-turn (OPT) sensor 114 is shown that, for each turn of the rotor, senses a sensing notch 116 on rotor 110. Sensing notch 116 may cause a voltage change in OPT sensor 114. As a result of the voltage change, OPT sensor 114 may measure a timing reference (TR) for each rotation of the rotor 110. A timing reference transmitter 117 may transmit the TR. OPT sensor 114 is shown attached to casing 112 but any method of securing OPT sensor 114 may be used. A plurality of blade passing signal (BPS) sensors 118 are also shown. At least one BPS sensor 118 is provided for each row of blades 108. Each BPS sensor 118 may sense a blade passing signal 120 for each blade 108 as it passes BPS sensor 118. BPS sensor 118 may sense a blade passing signal 120 for each blade 108 for each rotation of rotor 110. For example, BPS sensor 118 may be configured to sense the passing of blades 108 using one or more of a laser probe, a magnetic sensor, a capacitive sensor, a microwave sensor, or an eddy current sensor. However, BPS sensors 118 may be configured to sense blade passing signal 120 via any techniques known in the art.

An analog signal transmitter 122 transmits blade passing signal 120 as an analog signal 124. Splitter 126 receives analog signal 124 and splits it into at least two split analog signals 128. An analog-to-digital (AD) converter 130 for each split analog signal 128 receives split analog signal 128 and each AD converter converts each split analog signal 128 to least two digital waveform samples 132. At least two AD converters 130 alternate sampling of the at least two split analog signals 128. Each alternate sampling by at least two AD converters 130 may be spaced by substantially equal periods of time.

A person skilled in the art will readily recognize that more than two AD converters 130 may be used. In this embodiment, splitter 126 may split analog signal 124 into more than two split analog signals 128, a number equal to the number of more than two AD converters 130. Each of the more than two AD converters 130 convert each of more than two split analog signals 128 to at least two digital waveform samples 132.

Blade monitoring system 104 (e.g., via wireless or hard-wired means) may receive at least four digital waveform samples 132 for each analog signal 124 transmitted, store it in an external memory (not shown), or transmit it to an intermediate system where it may be obtained by a blade monitoring system 104. In particular the technical effect is blade monitoring system 104 can perform processes described herein to determine whether one or more blades 108 are damaged.

Figure 2:
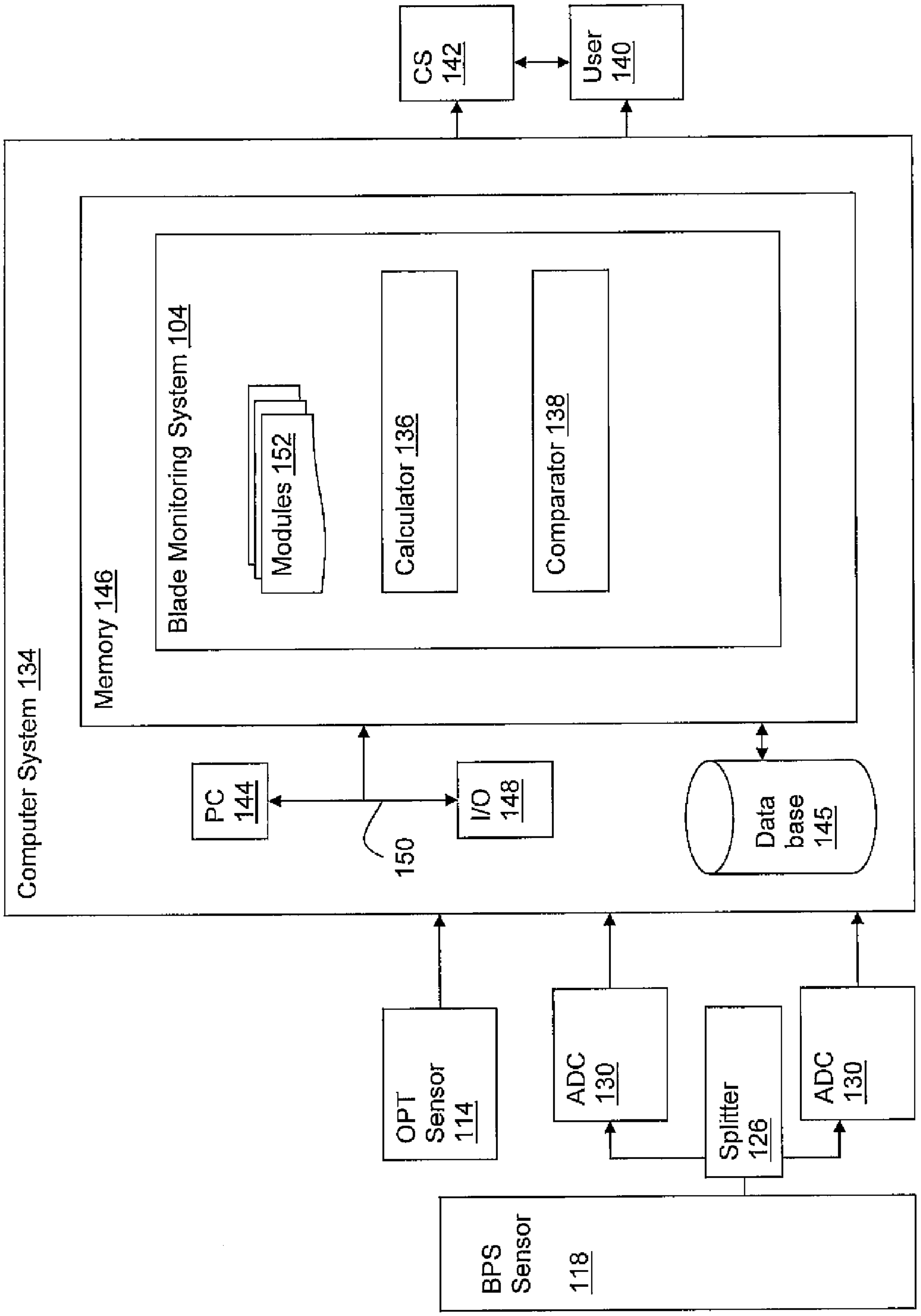
FIG. 2 shows a block diagram of one embodiment of an illustrative blade monitoring system in accordance with the invention.

Referring to FIG. 2, a block diagram of one embodiment of an illustrative blade monitoring system in accordance with the invention. Computer system 134 may include blade monitoring system 104, which makes computer system 134 operable to determine whether one or more blades 108 of compressor 106 are damaged. As indicated in FIG. 2, a calculator 136 and a comparator 138 may be optional components (or, modules) in blade monitoring system 104. Alternatively, calculator 136 and comparator 138 may be part of an external system (e.g., BPS sensor 118) which may perform the functions described herein.

Computer system 134 is shown in communication with a user 140. A user 140 may be, for example, a programmer or operator. Additionally, computer system 134 is shown in communication with a control system (CS) 142. CS 142 may be, for example, a computerized control system for controlling operation of compressor 106. Computer system 134 is shown including a processing component 144 (e.g., one or more processors), a database 145, a memory 146, an input/output (I/O) component 148 (e.g., one or more I/O interfaces and/or devices), and a communications pathway 150. In one embodiment, processing component 144 executes program code, such as blade monitoring system 104, which is at least partially embodied in memory 146. While executing program code, processing component 144 can process data, which can result in reading and/or writing the data to/from database 145, memory 146 and/or I/O component 148 for further processing. Communications pathway 150 provides a communications link between each of the components in computer system 134. I/O component 148 can comprise one or more human I/O devices or storage devices, which enable user 140 and/or CS 142 to interact with computer system 134 and/or one or more communications devices to enable user 140 and/or CS 142 to communicate with computer system 134 using any type of communications link. To this extent, blade monitoring system 104 can manage a set of interfaces (e.g., graphical user interface(s), application program interface, and/or the like) that enable human and/or system interaction with blade monitoring system 104.

In any event, computer system 134 can comprise one or more general purpose computing articles of manufacture (e.g., computing devices) for executing program code installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, blade monitoring system 104 can be embodied as any combination of system software and/or application software. In any event, the technical effect of computer system 134 is to determine whether one or more blade(s) 108 are damaged.

Further, blade monitoring system 104 can be implemented using a set of modules 152. In this case, a module 152 can enable computer system 134 to perform a set of tasks used by blade monitoring system 104, and can be separately developed and/or implemented apart from other portions of blade monitoring system 104. Blade monitoring system 104 may include modules 152 which comprise a specific use machine/hardware and/or software. Regardless, it is understood that two or more modules, and/or systems may share some/all of their respective hardware and/or software. Further, it is understood that some of the functionality discussed herein may not be implemented or additional functionality may be included as part of computer system 134.

When computer system 134 comprises multiple computing devices, each computing device may have only a portion of blade monitoring system 104 embodied thereon (e.g., one or more modules 152). However, it is understood that computer system 134 and blade monitoring system 104 are only representative of various possible equivalent computer systems that may perform a process described herein. To this extent, in other embodiments, the functionality provided by computer system 134 and blade monitoring system 104 can be at least partially implemented by one or more computing devices that include any combination of general and/or specific purpose hardware with or without program code. In each embodiment, the hardware and program code, if included, can be created using standard engineering and programming techniques, respectively.

Regardless, when computer system 134 includes multiple computing devices, the computing devices can communicate over any type of communications link. Further, while performing a process described herein, computer system 134 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

As discussed herein, blade monitoring system 104 enables computer system 134 to determine whether one or more blades 108 are damaged. Blade monitoring system 104 may include logic, which may include the following functions: a calculator 136 and a comparator 138. In one embodiment, blade monitoring system 104 may include logic to perform the below-stated functions. Structurally, the logic may take any of a variety of forms such as a field programmable gate array (FPGA), a microprocessor, a digital signal processor, an application specific integrated circuit (ASIC) or any other specific use machine structure capable of carrying out the functions described herein. Logic may take any of a variety of forms, such as software and/or hardware. However, for illustrative purposes, blade monitoring system 104 and logic included therein will be described herein as a specific use machine. As will be understood from the description, while logic is illustrated as including each of the above-stated functions, not all of the functions are necessary according to the teachings of the invention as recited in the appended claims.

Figure 3:
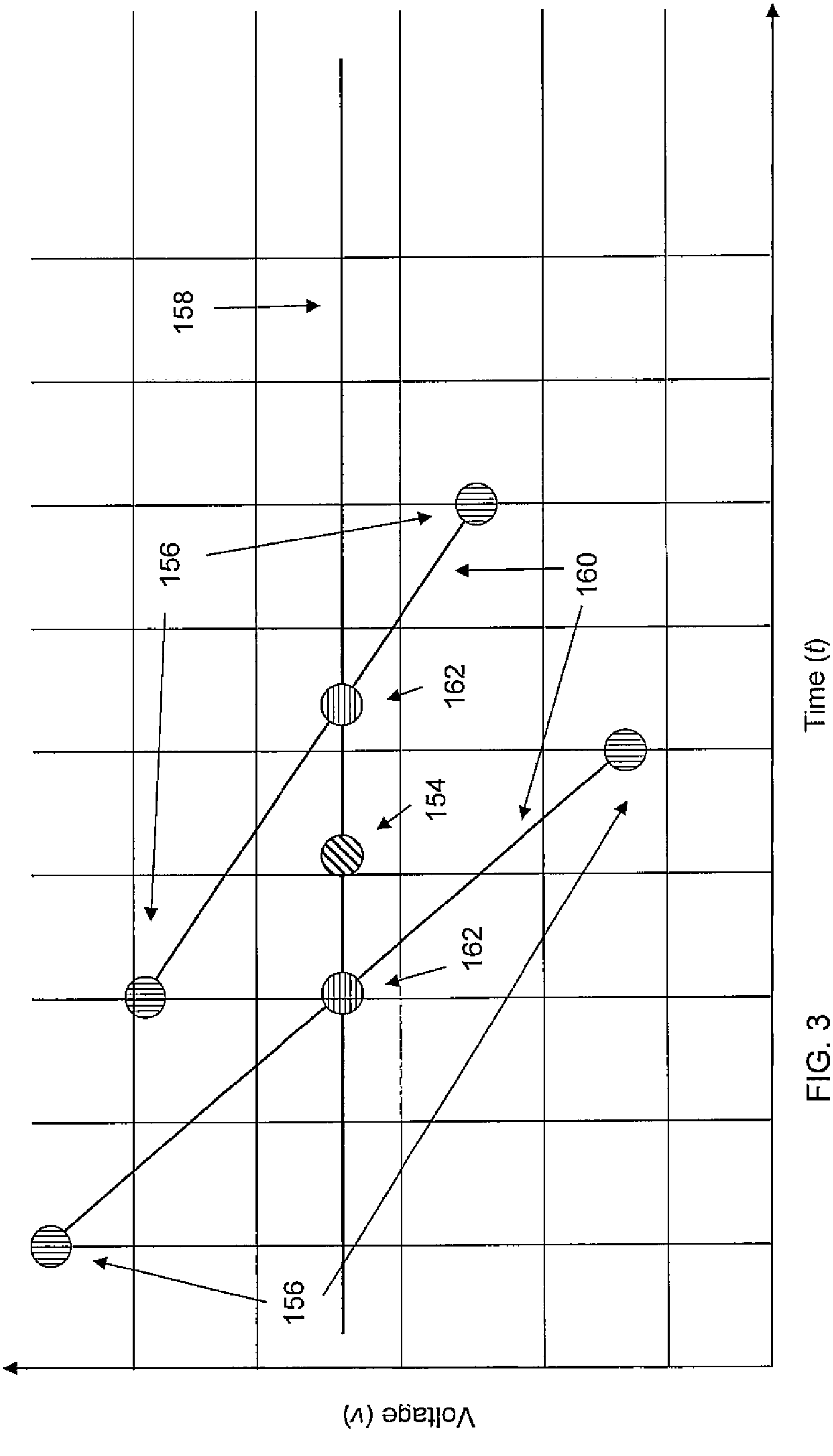
FIG. 3 shows a graphic representation for use in describing a method according to an embodiment of the invention.

Referring to FIG. 3, a graphic representation for use in describing a method of calculating an average threshold crossing (ATC) 154 is shown. The x-axis represents time (t) and the y-axis represents voltage (v). At least one digital waveform sample coordinate 156 may represent each digital waveform sample 132 by time (t) and voltage (v). A predetermined threshold level 158 provides a reference voltage for determining when blades 108 pass BPS sensor 118. In FIG. 3, at least two digital waveform sample coordinates 156 are shown connected by a digital waveform sample coordinates line 160 that crosses predetermined threshold level 158. As a result of the alternating sampling of the at least two split analog signals, at least two digital coordinates 156 connected by a digital waveform sample coordinates line 160 may represent at least two digital waveform samples 132 from the same AD converter 130. The point where digital waveform sample coordinates line 160 crosses predetermined threshold level 158 is an interpolated threshold crossing 162 for the at least two digital waveform sample coordinates 156. Calculator 136 (FIG. 2) of blade monitoring system 104 (FIG. 2) may calculate interpolated threshold crossing 162 for at least two digital waveform sample coordinates 156. Once at least two interpolated threshold crossings 162 have been calculated for two sets of at least two digital waveform sample coordinates 156, blade monitoring system 104 (FIG. 2) may average at least two interpolated threshold crossings 162 to obtain ATC 154. TR may be received from OPT sensor 114 and stored in memory 146 or database 145 of blade monitoring system 134 (FIG. 2). Blade monitoring system 134 (FIG. 2) may receive TR from timing reference transmitter 117. Alternatively, timing reference transmitter may transmit TR to memory 146 or database 145 and blade monitoring system 134 (FIG. 2) may receive TR from memory 146 or database 145. Calculator 135 (FIG. 2) may calculate a time of arrival (TOA) by subtracting TR from ATC 154.

In FIG. 3, each digital waveform sample coordinate 156 represents each digital waveform sample 132 from each AD converter 130 (FIG. 2) for a total of four digital waveform sample coordinates 156. In this case, as is shown, interpolated threshold crossing 162 may be calculated using a general equation of a line is v=mt+b where t is time, v is the voltage of digital waveform sample coordinate 156, m is the slope of the line, and b is the intercept. Threshold v0 may be predetermined. Threshold v0 may be a level for determining when blade passing signal 120 crosses the threshold (e.g. threshold level 158). To determine this, at least two digital waveform sample coordinates 156 are used to calculate interpolated threshold crossing 162 t0. Substituting v0 and t0 in the general equation of a line the equation becomes: v0=mt0+b. Each digital waveform sample coordinate 156 has a time tx and voltage vx. Two digital waveform sample coordinates 156 may be represented as (t1, v1) and (t3, v3). The slope of line m may be calculated for two digital waveform sample coordinates 156 as follows: m=(v3−v1)/(t3−t1). Once m is calculated, the intercept b may be calculated as follows: b=v1−mt1. With v0 pre-determined and m and b calculated from two digital waveform sample coordinates 156, t0 may be calculated as follows: t0=(v0−b)/m.

If more than two digital waveform sample coordinates 156 representing more than two digital waveform samples 132 are received from each AD converter 130 (FIG. 2), a person skilled in the art will readily recognize that calculating interpolated threshold crossing 162 could be done using a least squares linear fit. Alternatively, a person skilled in the art could use a higher order polynomial using a closed form or least squares approach. Such formulas are described, for example, in "Process Modelling and Simulation with Finite Elements" by William B. J. Zimmerman, World Scientific Publishing, Co. 2004.

Figure 4:
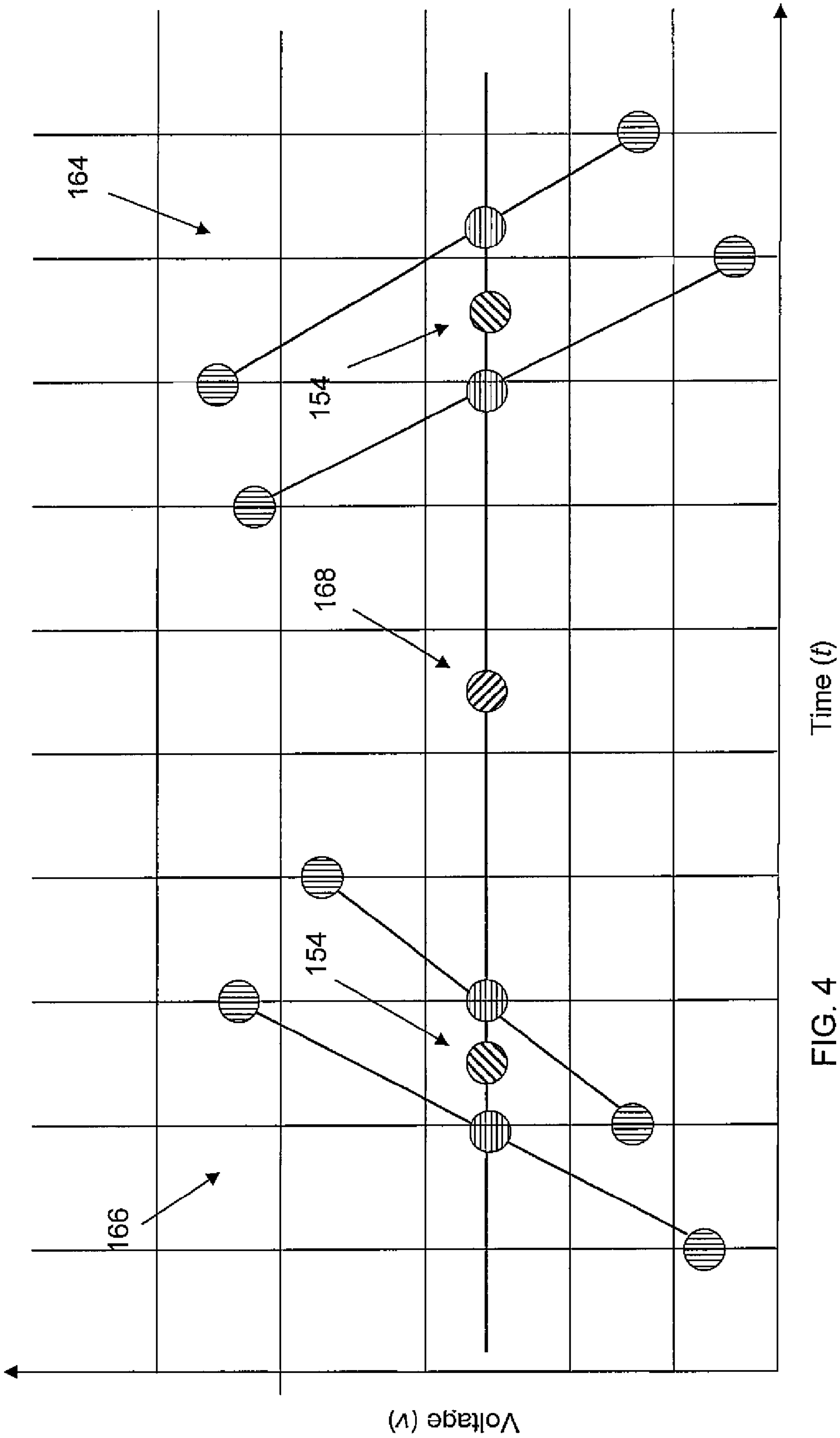
FIG. 4 shows a graphic representation for use in describing a method according to an embodiment of the invention.

Referring to FIG. 4, a graphic representation for use in describing a method of calculating a centroid of the pulse (CP) 168 is shown. The embodiment illustrated by FIGS. 3 and 4 may represent a positive blade pass pulse. A person skilled in the art will readily recognize that the invention described herein could be applied to a negative blade pass pulse. The x-axis represents time (t) and the y-axis represents voltage (v). Blade monitoring system 104 (FIG. 2) may calculate at least two ATC 154, at least one for an ascending side 166 of blade passing signal 120 (FIG. 2) and at least one for a descending side 164 of blade passing signal 120 (FIG. 2). TOA may be calculated for each of the at least two ATC 154. In one embodiment, calculator 136 (FIG. 2) may calculate CP 168 by averaging ATC 154 for ascending side 166 of blade passing signal 120 (FIG. 2) and ATC for descending side 164 of blade passing signal 120 (FIG. 2) and subtracting TR from CP 168.

An expected time of arrival (ETOA) for each blade may be predetermined when turbine 102 (FIG. 1) is in a known state. A known state may include, for example, during a start-up of turbine. ETOA may be stored in memory 146 or database 145 of blade monitoring system 134 (FIG. 2). Blade monitoring system 134 (FIG. 2) may receive ETOA from memory 146 or database 145.

Once TOA is calculated, comparator 138 (FIG. 2) may subtract TOA from ETOA to determine change of TOA (ΔTOA). Comparator 138 may compare ΔTOA to a pre-determined reference number, a pre-determined percentage of deviation from a reference number, or any method of determining degrees of difference between a value that represents substantially no damage to blade 108 and a value that represents some degree of damage to blade 108.

Referring again to FIG. 2, comparator 138 may compare ΔTOA to expected values representing one or more of blade 108 characteristics including a natural frequency, an overshoot, a rise time, a damping factor, or a settling time. The expected values for all these parameters (e.g., natural frequency, amplitude of vibration, static lean angle, etc.) may be calculated and stored beforehand, when the blades are in a known healthy or undamaged state. The deviations between a healthy and damaged blade 108 may depend on the geometry of blade 108, and the type, location and magnitude of the damage. Computer models may be used to generate the expected responses (e.g., expected parameter values such as natural frequency, amplitude of vibration, static lean angle, etc.) of one or more blades 108, and these expected responses are then used at run-time by the blade monitoring system 104 to determine whether a fault exists. The expected parameter values may be specific to compressor 106, and may be stored (e.g., in database 145 and/or memory 146), or provided to blade monitoring system 104 by a user 140, CS 142, or other external system.

User 140 and/or CS 142 may receive results of comparing from comparator and determine health of blade 108. User 140 and/or CS 142 may interact with computer system 134 and/or compressor 106 in response to receiving results.

In one embodiment, the invention provides a computer program embodied in at least one computer-readable storage medium, which when executed, enables a computer system (e.g., computer system 134) to determine whether one or more blade(s) 108 are damaged. To this extent, the computer-readable storage medium includes program code, such as blade monitoring system 104, which implements some or all of a process described herein. It is understood that the term "computer-readable storage medium" comprises one or more of any type of tangible medium of expression capable of embodying a copy of the program code (e.g., a physical embodiment). For example, the computer-readable storage medium can comprise: one or more portable storage articles of manufacture; one or more memory/storage components of a computing device; paper; and/or the like. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

In another embodiment, the invention provides a method of providing a copy of program code, such as blade monitoring system 104, which implements some or all of a process described herein. In this case, a computer system can generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program embodied in at least one computer-readable medium. In either case, the set of data signals can be transmitted/received using any type of communications link.

In still another embodiment, the invention provides a method of generating a system for determining whether one or more blade 108 is damaged. In this case, a computer system, such as computer system 132, can be obtained (e.g., created, maintained, made available, etc.) and one or more modules for performing a process described herein can be obtained (e.g., created, purchased, used, modified, etc.) and deployed to the computer system. To this extent, the deployment can comprise one or more of: (1) installing program code on a computing device from a computer-readable medium; (2) adding one or more computing and/or I/O devices to the computer system; and (3) incorporating and/or modifying the computer system to enable it to perform a process described herein.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A system, comprising:

a turbine including a compressor having at least one row of a plurality of blades;

a sensor for sensing a blade passing signal of at least one of the plurality of blades;

an analog signal transmitter for transmitting an analog signal for the blade passing signal;

a signal splitter for splitting the analog signal into at least two split analog signals;

at least two analog-to-digital (AD) converters, each AD converter converting each split analog signal to at least two digital waveform samples; and a blade monitoring system that:

calculates at least two interpolated threshold crossings, each interpolated threshold crossing calculated from at least two digital waveform samples from each AD converter, wherein the at least two digital waveform samples connect a digital waveform sample coordinates line and each interpolated threshold crossing is where the digital waveform sample coordinates line crosses a predetermined threshold level; and calculates an average threshold crossing (ATC) of the at least two interpolated threshold crossings.

2. The system of claim 1, wherein the blade monitoring system further:

calculates at least two ATC, at least one for an ascending side of a pulse and at least one for a descending side of the pulse; and calculates a centroid of the pulse (CP) by averaging the ATC for the ascending side of the pulse and the ATC for the descending side of the pulse.

3. The system of claim 2, further comprising:

a once-per-turn sensor for sensing a timing reference (TR);

a timing reference transmitter for transmitting the TR; and the blade monitoring system further:

receives the TR: and calculates a time of arrival (TOA) by subtracting the TR from at least one of ATC and CP.

4. The system of claim 3, wherein the blade monitoring system further:

receives an expected time of arrival (ETOA); and calculates a change of TOA (ΔTOA) by subtracting ETOA from TOA.

5. The system of claim 4, wherein the blade monitoring system further comprises determining whether the compressor blade is damaged based upon a change of TOA (ΔTOA).

6. The system of claim 1, wherein the turbine may be selected from a group consisting of: a gas turbine and a steam turbine.

7. The system of claim 1, wherein the sensor senses the blade passing signal using at least one of optical sensing, capacitive sensing, microwave sensing or eddy current sensing.

8. A method, comprising:
- sensing a blade passing signal of at least one blade;
- creating an analog signal for the blade passing signal;
- splitting the analog signal into at least two split analog signals;
- converting each split analog signal to at least two digital waveform samples; and
- calculating an interpolated threshold crossing for each of the at least two digital waveform samples, wherein at least two interpolated threshold crossings are calculated, wherein the at least two digital waveform samples connect a digital waveform sample coordinates line and each interpolated threshold crossing is where the digital waveform sample coordinates line crosses a predetermined threshold level; and
- calculating an average threshold crossing (ATC) of the at least two interpolated threshold crossings.

9. The method of claim 8, further comprising:
- receiving at least two ATC, at least one for an ascending side of a pulse and at least one for a descending side of the pulse; and
- calculating a centroid of the pulse (CP) by averaging the ATC for the ascending side of the pulse and the ATC for the descending side of the pulse.

10. The method of claim 9, further comprising:
- sensing a timing reference (TR);
- receiving the TR; and
- calculating a time of arrival (TOA) by subtracting the TR from at least one of the ATC and the CP.

11. The method of claim 10, further comprising:
- receiving an expected time of arrival (ETOA); and
- calculating a change of TOA (ΔTOA) by subtracting ETOA from TOA.

12. The method of claim 11, further comprising:
- determining whether the at least one blade is damaged based upon the ΔTOA.

13. The method of claim 8, wherein the sensing includes at least one of optical sensing, capacitive sensing, microwave sensing or eddy current sensing.

14. The method of claim 8, wherein the at least one blade is in a compressor of a turbine.

15. The method of claim 14, wherein the turbine may be selected from a group consisting of: a gas turbine and a steam turbine.

16. A computer program product comprising program code embodied in at least one non-transitory computer-readable storage medium, which when executed, enables a computer system to implement a method, the method comprising:
- receiving at least four digital waveform samples from at least two analog-to-digital (AD) converters, wherein a blade passing signal of a blade on a compressor in a turbine is transmitted as an analog signal, wherein a splitter splits the analog signal, wherein the at least two AD converters convert each split analog signal to at least two digital waveform samples;
- calculating an interpolated threshold crossing for the at least two digital waveform samples from each AD converter, wherein at least two interpolated threshold crossings are calculated, wherein the at least two digital waveform samples connect a digital waveform sample coordinates line and each interpolated threshold crossing is where the digital waveform sample coordinates line crosses a predetermined threshold level; and
- calculating an average threshold crossing (ATC) of the at least two interpolated threshold crossings.

17. The computer program product of claim 16, further comprising:
- receiving at least two ACT, at least one for an ascending side of a pulse and at least one for a descending side of the pulse; and
- calculating a centroid of the pulse (CP) by averaging the ACT for the ascending side of the pulse and the ACT for the descending side of the pulse.

18. The computer program product of claim 17, further comprising:
- receiving a timing reference (TR); and
- calculating a time of arrival (TOA) by subtracting the TR from at least one of the ATC or the CP.

19. The computer program product of claim 18, further comprising:
- receiving an expected time of arrival (ETOA); and
- calculating a change of TOA (ΔTOA) by subtracting ETOA from TOA.

20. The computer program product of claim 19, further comprising:
- determining whether the blade is damaged based upon the ΔTOA.

* * * * *